(12) United States Patent
Dedene et al.

(10) Patent No.: US 7,301,273 B2
(45) Date of Patent: Nov. 27, 2007

(54) DISPLAY ELEMENT ARRAY FOR EMISSIVE, FIXED FORMAT DISPLAY

(75) Inventors: Nele Dedene, Houthalen-Helchteren (BE); Robbie Thielemans, Nazareth (BE); Herbert Van Hille, Cambridge, MA (US)

(73) Assignee: Barco NV, Kortrijk (BE)

( * ) Notice: Subject to any disclaimer, the term of this patent is extended or adjusted under 35 U.S.C. 154(b) by 140 days.

(21) Appl. No.: 10/369,882

(22) Filed: Feb. 20, 2003

(65) Prior Publication Data

US 2004/0164667 A1 Aug. 26, 2004

(51) Int. Cl.
*H01J 1/62* (2006.01)
*H01J 63/04* (2006.01)

(52) U.S. Cl. ............... 313/500; 313/506; 313/512; 445/24

(58) Field of Classification Search ........ 313/504–507, 313/500, 512; 445/24
See application file for complete search history.

(56) References Cited

U.S. PATENT DOCUMENTS 5,294,870 A * 3/1994 Tang et al. ............... 313/504
6,166,489 A * 12/2000 Thompson et al. ......... 313/506
2002/0050958 A1* 5/2002 Matthies et al. ............ 345/55

FOREIGN PATENT DOCUMENTS

| JP | 08-190080 | 7/1996 |
| JP | 10-161567 | 6/1998 |
| JP | 11-008070 | 1/1999 |
| JP | 2000-235891 | 8/2000 |
| JP | 2000-323276 | 11/2000 |
| JP | 2001-143868-3 | 5/2001 |
| JP | 2001-332383 | 11/2001 |
| JP | 2002-008857 | 1/2002 |
| JP | 2002-260845 | 9/2002 |
| JP | 2002-372928 | 12/2002 |

* cited by examiner

*Primary Examiner*—Karabi Guharay
*Assistant Examiner*—Kevin Quarterman
(74) *Attorney, Agent, or Firm*—Barnes & Thornburg LLP

(57) ABSTRACT

The present invention provides a multicolor OLED pixel structure having a plurality of light emitting color elements, each color element emitting light of a particular color. Optical centers of the color elements coincide substantially at an optical center for the pixel structure and any portion of a color element of the pixel structure has an equally luminous portion of the same color element located diametrically opposite thereto with respect to the optical center of the pixel structure. Light from all the color elements adds to be able to form emitted white light. A plurality of pixel structures may be formed into an array for an active or passive display.

35 Claims, 14 Drawing Sheets

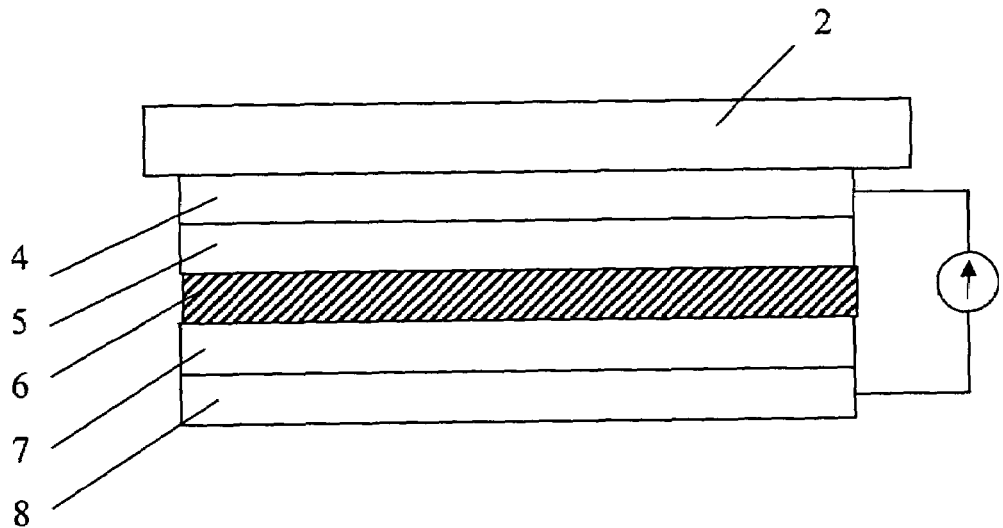
Fig. 1 – Prior Art –
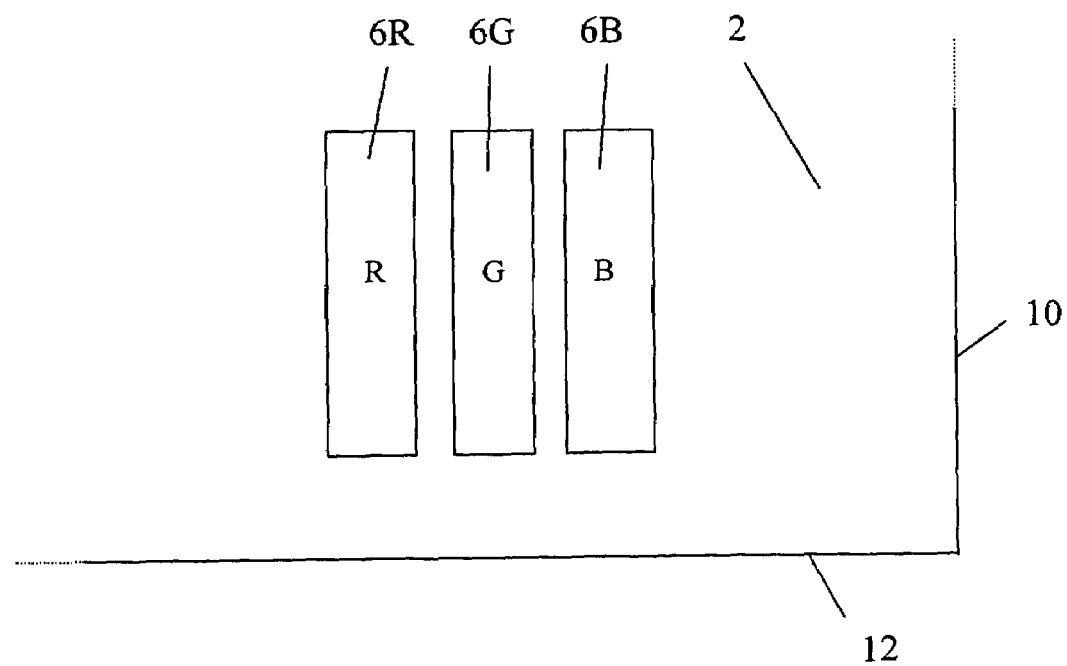
Fig. 2 – Prior Art –

DISPLAY ELEMENT ARRAY FOR EMISSIVE, FIXED FORMAT DISPLAY

FIELD OF THE INVENTION

The present invention relates to emissive, fixed format displays especially direct view displays, for instance having emissive elements comprising Organic Light Emitting Diodes (OLED) and methods of fabricating and operating the same.

BACKGROUND OF THE INVENTION

Emissive, fixed format especially direct view displays such as Light Emitting Diode (LED), Field-Emission (FED), Plasma, EL and OLED displays have been used in situations where conventional CRT displays are too bulky and/or heavy and provide an alternative to non-emissive displays such as Liquid Crystal displays (LCD). Fixed format means that the displays comprise an array of light emitting cells or pixel structures that are individually addressable rather than using a scanning electron beam as in a CRT. Fixed format relates to pixelation of the display as well as to the fact that individual parts of the image signal are assigned to specific pixels in the display. Even in a color CRT, the phosphor triads of the screen do not represent pixels; there is neither a requirement nor a mechanism provided, to ensure that the samples in the image in any way align with these. The term "fixed format" is not related to whether the display is extendable, e.g. via tiling, to larger arrays. Fixed format displays may include assemblies of pixel arrays, e.g. they may be tiled displays and may comprise modules made up of tiled arrays which are themselves tiled into supermodules. Thus "fixed format" does not relate to the fixed size of the array but to the fact that the display has a set of addressable pixels in an array or in groups of arrays. Making very large fixed format displays as single units manufactured on a single substrate is difficult. To solve this problem, several display units or "tiles" may be located adjacent to each other to form a larger display, i.e. multiple display element arrays are physically arranged side-by-side so that they can be viewed as a single image. Transferring image data by packetized data transmission to the various display devices makes segregation of the displayed image into tiles relatively easy. At the junction of the tiles, usually some means to hide the join is applied. Such could be an opaque mask, as is for instance done in the case of tiled LCD displays, where the image of individual LCD panels is projected on a black matrix. To maintain a uniform appearance to the display, this mask is extended over the complete surface of the display and comprises an array of openings that coincide with the light emitting pixel structures of the display, or an array of openings that coincides with a group of light emitting pixel structures of the display (e.g. array of 4×4 pixels in one opening of the mask). OLED displays provide certain advantages for tiled displays such as light-weight, ease of manufacture, wide angle of view, and the ability to use back-connectors which allows close tiling with the smallest joint between tiles.

The human eye can detect very subtle color shifts or brightness changes and the optical non-uniformity and asymmetry introduced at the borders of tiles can produce disturbing optical effects. The traditional method of manufacture of OLED displays results in a pixel structure as shown schematically in FIG. 1 with a transparent substrate 2, usually a glass substrate, being closest to the viewer and facing in the display direction. Behind this substrate a series of layers 4-8 are deposited, e.g. at least a first transparent electrode 4, the organic light emitting element 6 and a second electrode 8. An organic LED material is deposited for each color in each pixel structure, e.g. three color elements 6, red, green and blue, for each pixel structure. Thus, each pixel structure can emit white light or any color by controlling the light energy emitted from each color element of a pixel structure. Usually additional layers are deposited such as electron and hole transport layers 7, 5 (see FIG. 1 that has been adapted from FIG. 4-13 of "Display Interfaces", R. L. Myers, Wiley, 2002). Thus, the light emitting elements 6 are located at a certain distance below the transparent substrate 2 and light can be reflected towards the viewer from the edges of the glass substrate 2 at the tile edges. Which light is reflected depends on which color element 6 of the edge-closest pixel structure is closest to the edge of the tile. The conventional color elements 6R, 6G, 6B of one pixel structure of an OLED are shown in FIG. 2 deposited onto a substrate 2—the electrodes and other layers are not shown. The color elements 6R, 6G, 6B are arranged in parallel, rectangular strips. The tile edge effect of such an arrangement differs depending upon which edge 10, 12 of the tile is closest to the pixel structure. If the edge (10) is parallel to the strips, then the light reflected towards the viewer from the edge of the glass substrate 2 at certain viewing angles will be dominated by the color of the closest color emitting element 6, e.g. 6B emitting blue light. This color will generate a color shift near the tile edge 10 generating a colored "halo" effect along edge 10, particularly at certain viewing angles. At the edge 12, all three color elements are equally close to the edge and therefore balanced colored light is reflected from the tile edge. This will not cause a color shift but may make the edge look slightly brighter or darker at certain viewing angles.

A further problem is the effect of viewing angle and parallax resulting in vignetting, e.g. with masks or other optical elements. As there is a significant distance in the viewing direction between the emitting point of light of the OLED pixel structure and the mask, a viewer will see light emitted from more or less of the pixel structure surface area depending on the angle of view (see FIG. 3a). This distance is determined as a minimum by the thickness of the substrate 2. This problem can be reduced by using non-occluded masks. A non-occluded mask has openings which are larger than the light emitting surface area of a pixel structure so that when viewed along a normal to the pixel structure, light from the complete emitting surface of the pixel structure can be seen (non-occluded mask 9 of FIG. 3a). However, even with a non-occluded mask 9, parallax effects caused by the mask can occur at larger angles of view, an effect called vignetting. The effect of vignetting is to reduce the light intensity from a part of the pixel structure. If this part has a predominance in one of the colors emitted from the pixel structure, the result will be a color shift which depends on viewing angle. In addition, mask misalignment can reduce the viewing angle in the direction in which an edge of the mask opening is closest to the pixel structure (see FIG. 3b) and/or can produce color shifts.

A further problem can occur with displays in which an array of optical elements is used, e.g. commercial large size displays such as e.g. as used in shopping malls, train stations, airports etc. Such displays may be arranged on a wall at a certain distance from the average viewer. Due to physical restrictions such as the height of the target observer who will normally be between 1 and 2 meters, it is not necessary for the display to emit light in a wide angle. Power and cost can be saved by directing the display beam only within a useful angle. One way of doing this is to provide an optical element such as a lens in front of the display that concentrates the emitted light within the desired viewing angle. For instance, each pixel structure may be associated with a lens. However, misalignments between the optical axis of the lens and the pixel structure as well as the difference in optical centers of gravity of each color element of a conventional pixel structure means that the color displayed depends on the angle of view. A known partial solution to this problem is described in US 2002/0050958 that requires each color element of a pixel structure to have its own lens. However, for high resolution displays this involves manufacturing and accurately placing very small lenses. The array of optical elements can have other functions besides the tailoring of the light distribution produced by the pixels.

SUMMARY OF THE INVENTION

It is an object of the present invention to provide emissive, fixed format displays, especially tiled arrays made up of smaller display tiles, for instance, OLED displays which do not show as many of the color shift effects of conventional displays as well as methods of manufacturing and operating such improved displays.

The present invention provides a multicolor OLED pixel structure, comprising: a plurality of light emitting color elements, each color element emitting light of a particular color, the optical centers of the color elements coinciding substantially at an optical center for the pixel structure; any portion of a color element of the pixel structure having an equally luminous portion of the same color element located diametrically opposite thereto with respect to the optical center of the pixel structure. Light from all the color elements may add to be able to form emitted white light. The symmetry of the pixel structure provides improved operation when an optical element is placed between the pixel structure and the viewer, e.g. a lens or for example a mask, either occluded or non-occluded. The outer shape of the pixel structure may be polygonal, e.g. in particular rectangular as this allows good packing of the pixel structures in a rectangular array. Preferably, each one or more color elements which emit one color are arranged symmetrically about a line passing through the optical center. Each one or more color elements which emit one color are preferably arranged symmetrically about a second line passing through the optical center which is perpendicular to the first line. Advantageously the plurality of light emitting color elements comprise elements which emit light of one of three or more primary colors, and one or more color elements emitting one primary color are arranged substantially concentrically with respect to one or more color elements emitting another primary color.

The plurality of light emitting color elements preferably comprise rectangular elements arranged in a row. The pixel structure has an outer envelope which defines the periphery of a light emitting area and the plurality of light emitting color elements preferably comprise elements which emit light of one of a number of primary colors, a light emitting element of each primary color extending to the outer envelope.

Preferably, the light emitting elements emitting one color extend to at least two different positions on the periphery, e.g. as defined by an envelope around the light emitting areas. This reduces color shifts as all color elements are exposed or occluded by vignetting elements. The pixel structure may be sandwiched between a first main electrode common to all light emitting color elements and a plurality of second electrodes, each second electrode contacting one of the light emitting color elements. Preferably, the pixel structure has a plurality of conducting areas local to each pixel for connection to an electrical power supply. By using local contacts the supply to each pixel structure can be improved.

The present invention also provides an array of pixel structures as described above. For example, each pixel structure being located on a transparent or an opaque substrate, each pixel structure comprising: a plurality of light emitting color elements, each color element emitting light of a particular color; the optical centers of the color elements coinciding substantially at an optical center for the pixel structure; any portion of a color element of the pixel structure having an equally luminous portion of the same color element located diametrically opposite thereto with respect to the optical center of the pixel structure. In the array each pixel structure can be sandwiched between a first main electrode common to all light emitting color elements and a plurality of second electrodes, each second electrode contacting one of the light emitting color elements. Each pixel structure preferably has a plurality of conducting areas local to each pixel for connection to an electrical power supply. The conductive areas may be for connection to a PCB. The array may have a display direction and may further comprise an optical element located on the display direction side of the array. The optical element can be a vignetting element, a lens or a mask or similar.

The pixel structures in array form may form a passive matrix OLED display. The display may be a display tile. Tiles may be abutted to each other in a linear or a 2 or more dimensional array of tiles to form a larger array, a module of a display formed from a plurality of modules, a supermodule and an array formed from a plurality of such supermodules, etc.

The present invention provides a method of manufacture of a multicolor OLED pixel structure, comprising: forming a plurality of light emitting color elements on a substrate, each color element being for emitting light of a particular color; the optical centers of the color elements coinciding substantially at an optical center for the pixel structure; any portion of a color element of the pixel structure having an equally luminous portion of the same color element located diametrically opposite thereto with respect to the optical center of the pixel structure. The pixel structures may be formed in an array, whereby each of the pixel structures in the array and each color element may be addressed separately. The array by be formed into a display and may be provided with contacts for back connecting the array to electronic circuitry, e.g. driver circuits, addressing circuits, power circuits.

The dependent claims define independent embodiments of the present invention. The present invention will now be described with reference to the following drawings.

BRIEF DESCRIPTION OF THE DRAWINGS

FIG. 1 shows a cross-section through the layers of a conventional OLED pixel structure.

FIG. 2 shows a top view of the color elements of a conventional OLED multi-color pixel structure.

DESCRIPTION OF THE ILLUSTRATIVE EMBODIMENTS

Figure 3A:
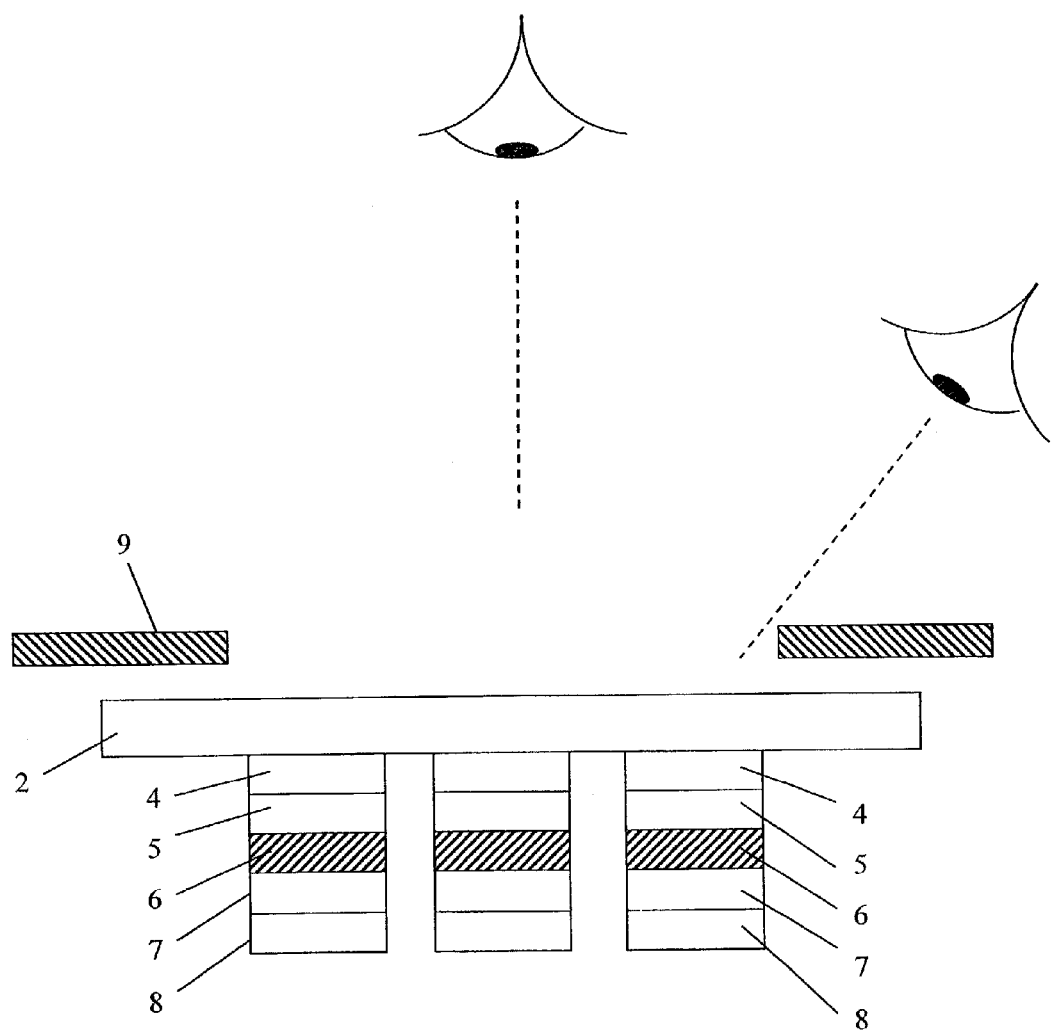
FIG. 3a shows a non-occluded mask that can be used with the present invention and FIG. 3b shows parallax/vignetting effects which occur when there is mask misalignment.
Figure 3B:
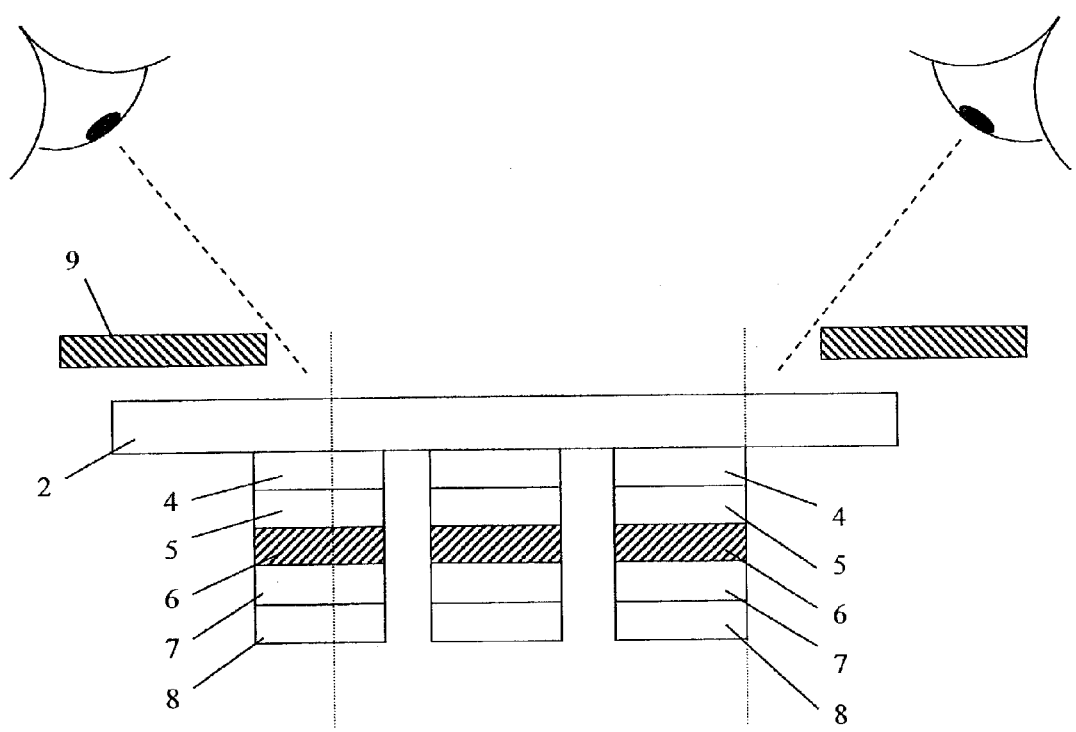

The present invention will be described with reference to certain embodiments and to certain drawings but the present invention is not limited thereto but only by the attached claims. The embodiments are presented by way of example only and the skilled person will appreciate that the present invention has a wide application. For example, the present invention will be particularly described with reference to tiles for tiled displays that require back-connections but the present invention is not limited thereto and may be used with non-tiled displays. Further, the present invention provides arrays of emissive pixels provided with a means for directing or obscuring light in certain directions, e.g. a mask or an optical element such as a lens, a Fresnel lens, a diffraction grating, a holographic element such as a hologram, a diffractive or refractive optical element or a combination of any of these. For instance, the display can either have a mask, or an optical element per pixel such as a lens, or a plurality of lenses/optical elements per pixel, e.g. microlenses, or a combination of optical element(s), especially refractive optical elements and a mask. Lenses and masks both cause vignetting and result in color shifts unless the pixel area is oversize and the vignetted area of the pixel is compensated by an emissive part on the other side of the symmetry axis of the pixel becoming apparent, i.e. another part diametrically opposite in the pixel layout which contributes to the emissive light output which is exposed when the other side of the pixel is vignetted. When a mask is used and a color shift occurs, this color shift will always be caused by vignetting. Vignetting is defined as the gradual reduction of luminance as the off-axis angle increases resulting from the partial obscuration of the light bundle by limiting apertures of optical elements within the optical system. Due to the fact that there is a distance between the active emissive elements of an OLED and the mask lying on or adjacent to the outer surface of the substrate, the mask can reduce the optical aperture of the pixel and cause vignetting. When an asymmetric color pixel structure is vignetted then the part of the aperture which is obscured will contain more of one color than the others. Thus it will cause a color shift. This is most pronounced at the edges of the display, i.e. where the viewing angle is not perpendicular to the display. However, when an optical element such as a lens is used, the color shift can be caused by vignetting and/or the operation of the optical element or especially defects therein. Optical elements can give rise to a color shift, without the occurrence of vignetting. The fact that the optical centers of the different colors in a pixel do not coincide gives rise to a color shift due to refraction effects in the optical element. If one color center is located far off the optical axis of a lens, then it will refract differently than another color center lying close to the axis. Thus, colors will be directed from the optical element in different directions and the color generated by the pixel will depend upon viewing angle. In one aspect of the present invention either or both types of problems can be solved by using a sub-pixel emissive element layout having certain types of geometric symmetry.

The present invention will mainly be described with reference to a passive matrix display for which it is ideally suited. However, the present invention may also be used in active matrix displays. The present invention will also mainly be described with reference to depositing light emitting elements onto a transparent substrate. However, the present invention includes deposition onto other substrates, e.g. opaque or translucent substrates. The opaque substrate may be a ceramic material for example. When an opaque substrate is used the arrangement as shown as shown schematically in FIG. 1 may be applied to an opaque substrate 2, being furthest from the viewer and facing away from the display direction. In front of this substrate a series of layers 4-8 are deposited, e.g. at least a first transparent electrode 4, the organic light emitting element 6 and a second electrode 8. An organic LED material is deposited for each color in each pixel structure, e.g. a plurality of color elements 6, red, green and blue, for each pixel structure, whereby there may be more than one color element for each primary color. Each pixel structure can emit white light or any color by controlling the light energy emitted from each color element of a pixel structure. Usually additional layers are deposited such as electron and hole transport layers 7, 5. On top of these elements a transparent encapsulating or sealing layer may be applied, deposited or fixed (not shown in FIG. 1). Just as for the device described with reference to FIG. 1, the light emitting elements 6 are located at a certain distance below encapsulation layer and light can be reflected towards the viewer from the edges of the layer at the tile edges. The tile edge effect of such an arrangement is similar to the effects described for the device of FIG. 1. Also, at the front side an optical element such as a vignetting element, a lens, a mask, a Fresnel lens, a hologram or similar may be applied or fixed.

The present invention will also mainly be described with reference to a rigid material for the substrate 2. However, the present invention is not limited thereto. The present invention also includes depositing OLED color emitting elements onto flexible substrates such as polyester or polyimide substrates to form a flexible display sheet.

Figure 4:
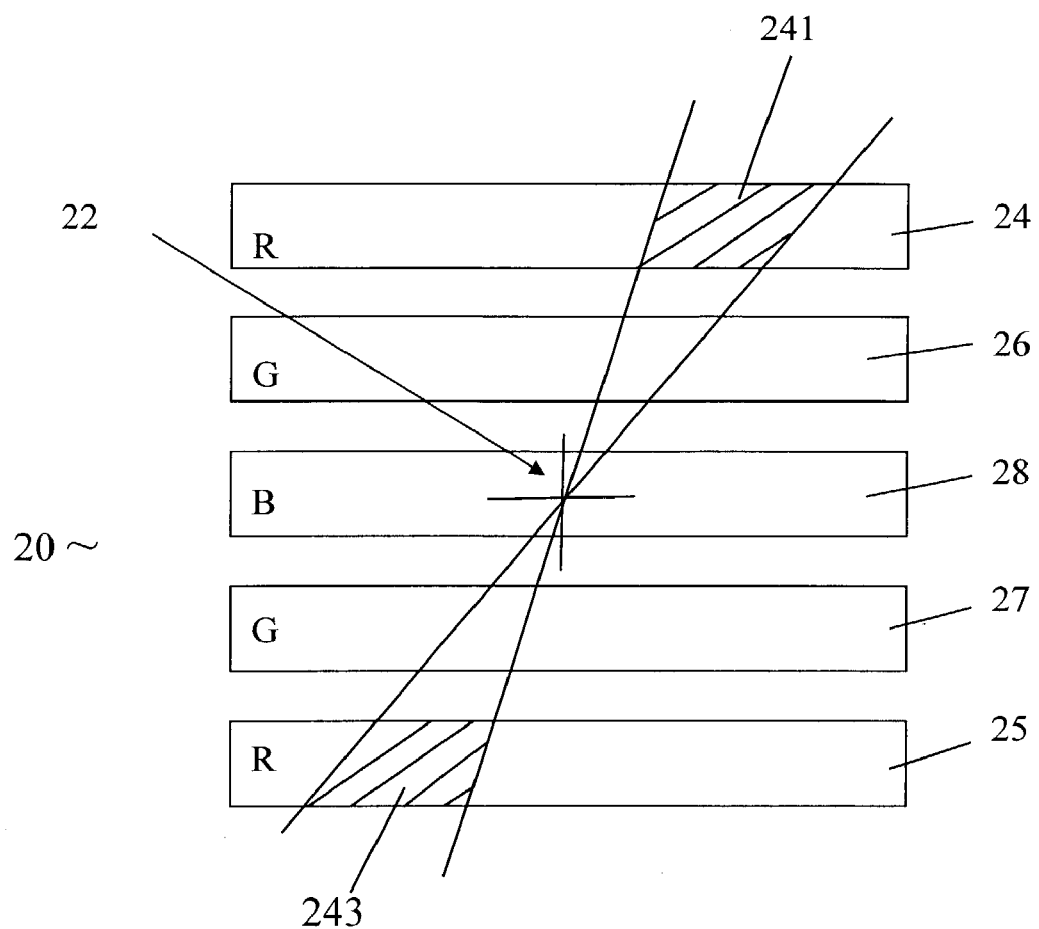
FIG. 4 shows a schematic representation of a pixel structure design in accordance with an embodiment of the present invention.

FIG. 4 is a schematic representation of a front view of an OLED multicolor pixel structure 20 suitable for use with an optical element such as a lens or with a mask or other vignetting element in accordance with one embodiment of the present invention. The lens may have a size (i.e. area) of at least the pixel structure or greater rather than being the size of one color element 24, 26, 28 of the pixel structure 20. The electrodes have been omitted from this drawing for clarity purposes. In this structure, each portion of a color element 24-28, e.g. 241, has an equally sized or equally luminescent area of the same color element 24-28, e.g. 243 located diametrically opposite from it with respect to the optical center 22 of the pixel structure 20. The optical center of a group of emissive sub-pixel elements of the same emissive color is the "center of gravity" of the luminous output of the combined group. Preferably, each color element or combination of color elements for one color 24-28 has an optical center that coincides at least approximately with the optical center 22 of the pixel structure 20. In this way, any color emitting sub-element 24-28 is at least locally diametrically symmetrical with respect to the optical center 22. This symmetrical arrangement with coinciding optical centers for all emissive colors, means, when the pixel structure is combined with a refractive optical element, that the combined light emitted from all of the color elements 24-28 is always projected from the optical element in a similar direction.

Figure 5:
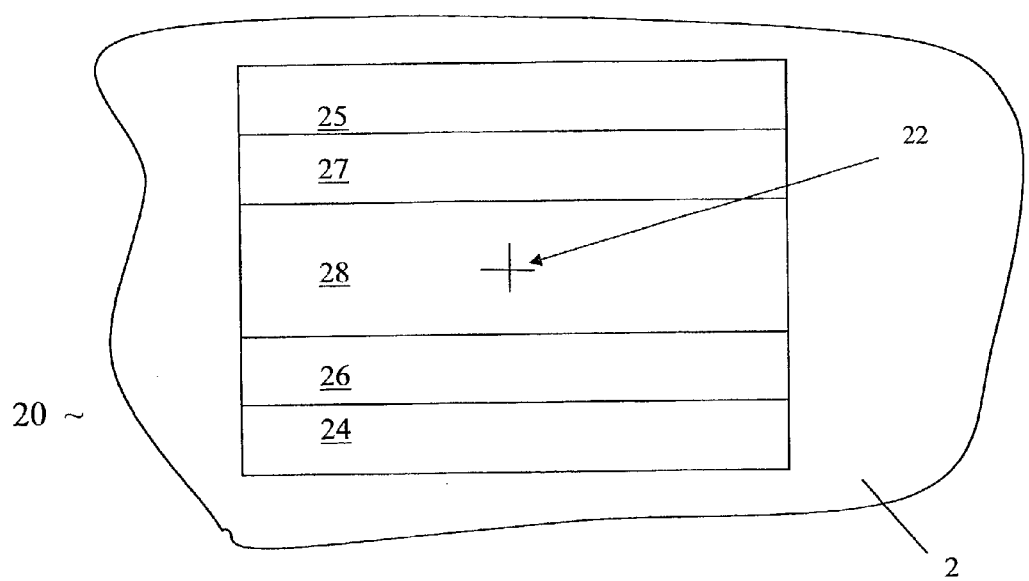
FIGS. 5-9 show schematic representations of alternative pixel structure designs in accordance with embodiments of the present invention.
Figure 6A:
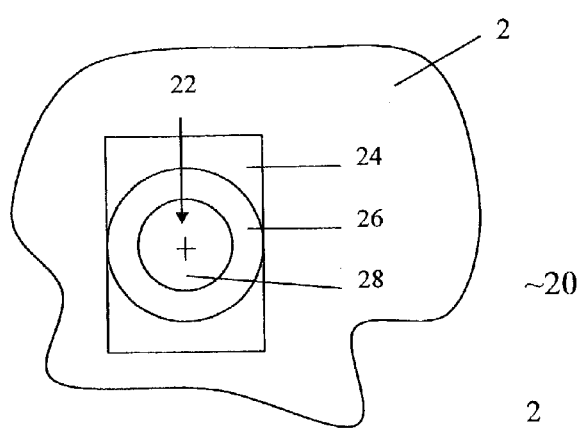
Figure 7:
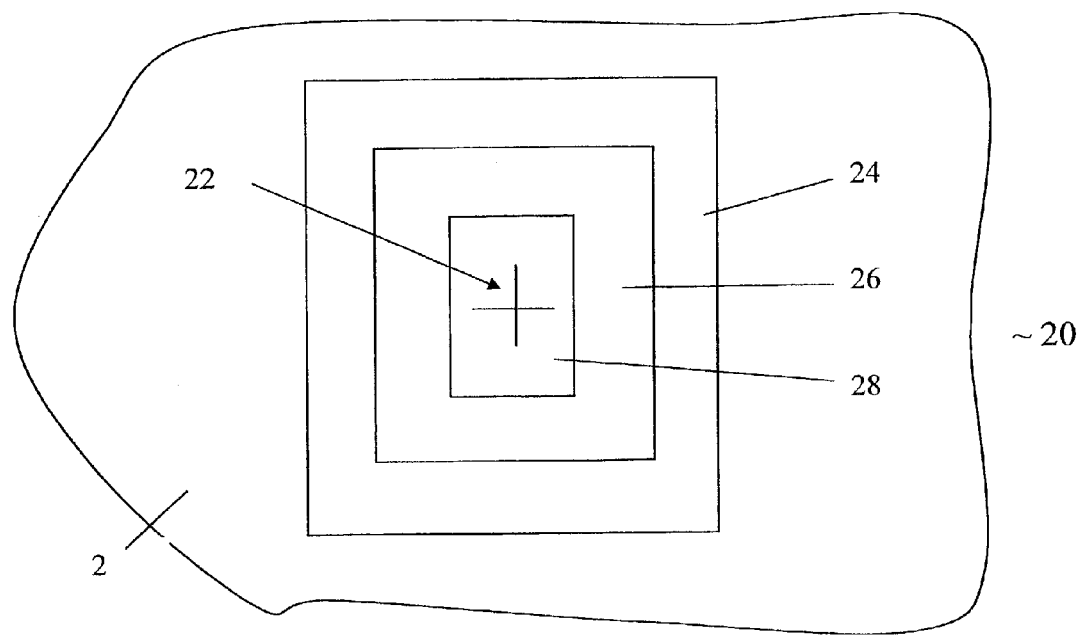
Figure 8:
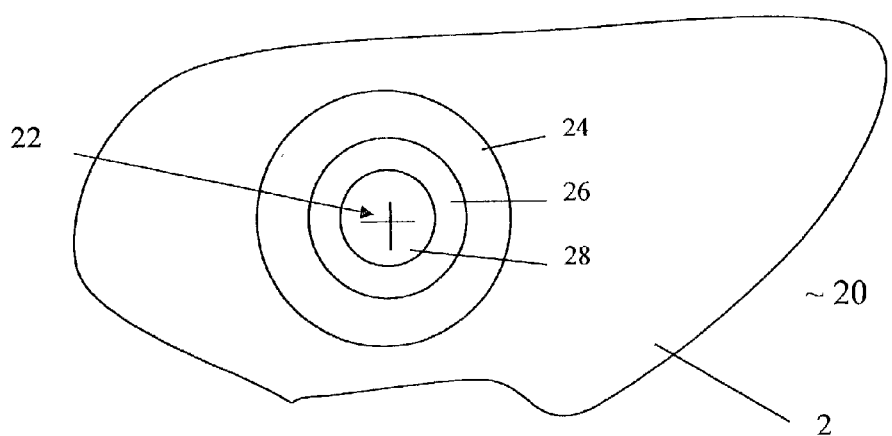

Various degrees of symmetry may be provided in each pixel structure. Some examples are shown schematically in FIGS. 5 to 8. In FIG. 5, the three color elements 24, 26, 28 are arranged as pairs of parallel strips 24, 25; 26, 27; with a central single strip 28 in each pixel structure 20—similar to that shown in FIG. 4. The three color elements are arranged symmetrically around the optical center of gravity 22. In this case lines of symmetry can be identified that are orthogonal lines passing through the optical center 22. In FIGS. 6A and B, more symmetry is provided and the areas of light emitting OLED material are no longer parallel strips. Also, in this case, there is local diametrical symmetry about the optical center 22 for each color separately at any orientation angle, but the area of one color element (the outer one) varies with the polar angle. In FIGS. 6A and B a central circular color element 28 is surround by a concentric annular color element 26. These two are rotationally symmetric. The outer color element 24 has an outer rectangular form with an inner circular form. In FIGS. 7 and 8 the degree of symmetry is the same as for FIG. 6 as the color elements 24, 26, 28 are arranged symmetrically about the optical center 22 of the pixel structure independent of the orientation of the portion of the color element considered. In FIGS. 7 and 8 the color elements have been arranged in a series of concentric areas, e.g. rings in FIG. 8 and rectangular annulae in FIG. 7. In FIG. 7 the area of the color elements vary with the polar angle, i.e. are non-rotationally symmetric. In FIG. 8 the area of any color element remains the same at any angle with respect to the optical center 22, i.e. the structure is perfectly rotationally symmetrical.

Figure 9:
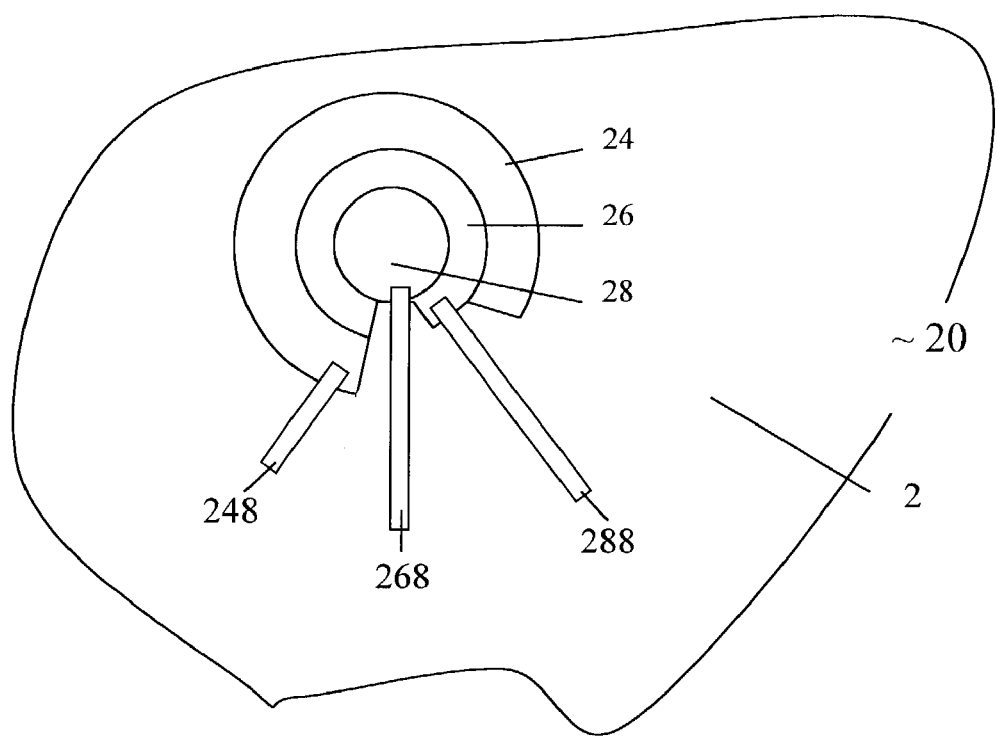

With respect to the arrangement of the electrodes for driving the color elements, the pixel structure of FIG. 5 is similar to the conventional structure but has two extra strips arranged in such a way that the color sequence across the pixel structure is symmetric, which increases the complexity of the electrode structure only slightly. However, the structures shown in FIGS. 6 to 8 can cause major changes in the way the electrodes are contacted to each color element as some of the color elements can only be reached for electrical contact by crossing over other color elements. Due to the fact that there are only a limited number of materials which are sufficiently transparent and also conductive, the arrangement of the electrodes is not straight forward. In accordance with an aspect of the present invention, modifications may be made to the shapes of the color element areas to improve electrode accessibility. For example, the structure of FIG. 7 or 8 may be modified as shown schematically in FIG. 9 (for the structure of FIG. 8 only). In this structure access to the inner color elements 26 and/or 28 has been achieved by leaving gaps in the surrounding outer color elements 24 or 26 so that contact strips 248, 268, 288 may be connected to the relevant color element without having to cross over another color element. The disadvantage of this arrangement is that some of the symmetry has been lost.

Figure 10:
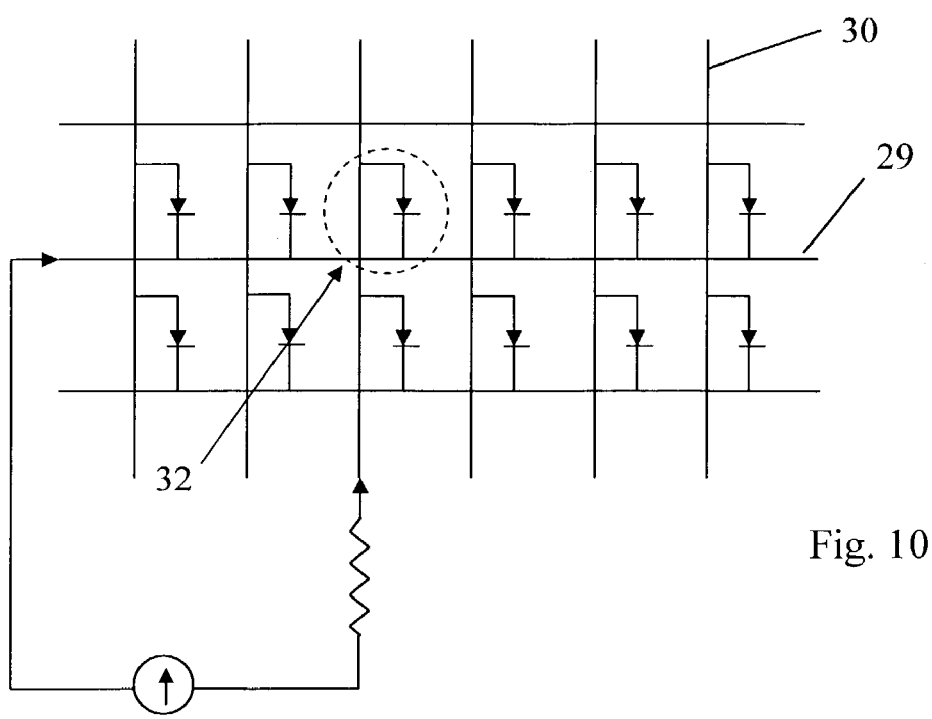
FIG. 10 is a schematic representation of a Cartesian pixel structure array that can be used with the present invention.
Figure 11:
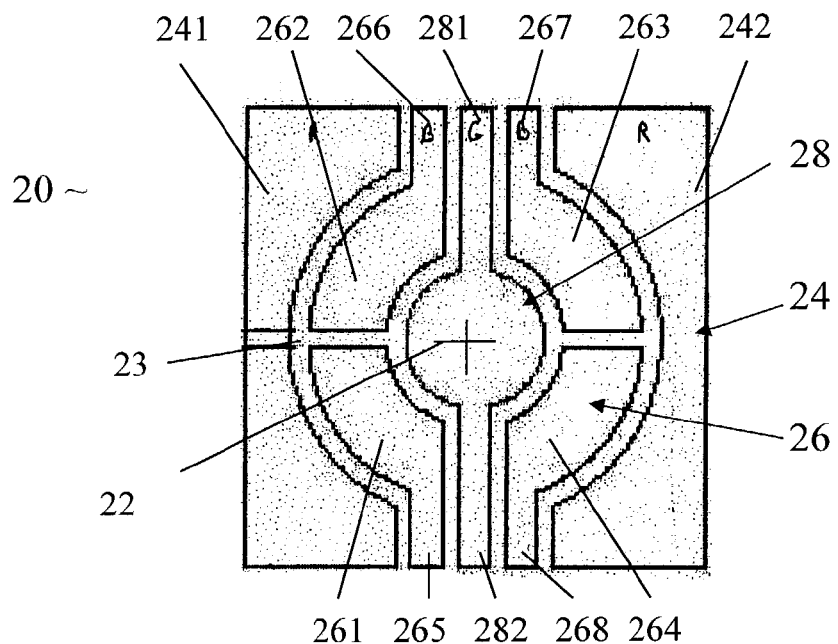
FIG. 11 shows a preferred pixel structure in accordance with an embodiment of the present invention.

A preferred pixel structure 20 is shown in FIG. 11 and will be explained with reference to FIG. 10. In FIG. 10 a schematic fixed format display is shown comprising an array of pixel structures which are addressed in logical rows and columns by means of row and column lines 29, 30 respectively. The display may be a tile of a larger tiled display. For example, the display may be a tile of a module which, when mounted with other modules forms a larger tiled array. It is understood that in the case of an OLED array, the lines 29 and 30 contact respective sides of layers of deposited organic material. By "logical rows and columns" is meant that each pixel structure can be addressed by applying electrical current to both a row line and a column line which cross at a pixel structure 32 to be addressed. However, the actual array of pixel structures need not be in rows and columns, it can be polar, for instance, i.e. radial and circumferential addressing. The word "logical" in the expression "logical rows and columns" means that the method of addressing is as if there were rows and columns of pixel structures but that the physical arrangement of pixel structures could be a different one. Hence, "logical rows and columns" relates to the topology and not necessarily the topography.

In order to address each one of the pixel structures individually it is necessary to provide both cathode and anode electrode strips 29, 30 which contact opposite sides of the organic material that emits the light in each color element of a pixel structure. Ideally, the arrangement of electrodes should be such that standard manufacturing techniques can be used, e.g. those developed for manufacture of semiconductor devices and other forms of displays such as Liquid Crystal Displays (LCD). Typical for these techniques is multilayer patterning using photoresists. General methods of lithographic patterning using photoresists may be found in the book entitled: "Microlithography" by J. R. Sheats and B. W. Smith, Marcel Dekker, 1998. General methods of deposition and etching of materials may be found in the book "The Science and Engineering of Microelectronics Fabrication", S. A. Campbell, Oxford, 2001.

Figure 6B:
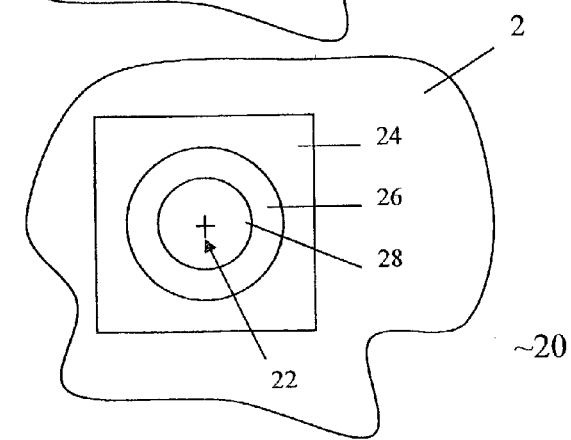

The pixel structure 20 of FIG. 11 combines elements of the structures of FIGS. 5 and 6 in an optimum way. It comprises a single central area for one color element 28. This central area is preferably circular but other shapes are possible such as square or hexagonal. The central area is preferably a block area rather than being divided into segments. A second color element 26 substantially surrounds the first color element 28 to form a color element substantially concentric with the first color element 28. It is made up of 2, optionally 4 sub-elements 261-264. Each sub-element 261-4 has the form of an approximate sector of an annulus, either approximately 180° of an annulus (not shown) or approximately 90° of an annulus. Again a substantially circular annulus is shown but other shapes are possible such as hexagonal or square. The third color element 24 substantially surrounds the second color element 26. It has an outer polygonal periphery, preferably a substantially rectangular periphery, preferably square, and an inner periphery, which is matched to the outer periphery of the second color element 26, e.g. a substantially circular, hexagonal or square periphery. It is made up of two sub-elements 241, 242 located symmetrically on either side of the pixel structure 20. Each sub-element is separated from at least one sub-element of another color element by means of a gap 23 which is an electrically isolating gap so that each element is electrically isolated from the others and each is individually contactable.

The first and central color element 28 has two elongate areas 281, 282 which extend away from the center 22 of the pixel structure 20 in opposite directions and terminate at a position co-located with the envelope of the outer periphery of the third color element 24. Each of the two or four sub-elements 261-264 of the second color element 26 has an elongate area 265-268 which extends generally away from the center 22 of the pixel structure 20 and runs parallel to one of the elongate areas 281, 282 of the first color element 28. Each of these elongate areas 265-268 terminates at a position co-located with the envelope of the outer periphery of the third color element 24. The shape of the pixel structure 20 is generally rectangular. Additionally, the quadratic area of the pixel structure is substantially filled up with light emitting sub-elements except for the isolating gaps 23. This is efficient on area when many such pixel structures are arranged in a Cartesian array on a transparent or an opaque substrate. This arrangement has also been found to be particularly easy to integrate into conventional thin-film processing techniques and provides a degree of symmetry for use with an optical element such as a lens having a size as large as or larger than the area of one pixel structure 20 and such as to reduce color shifts.

Figure 12:
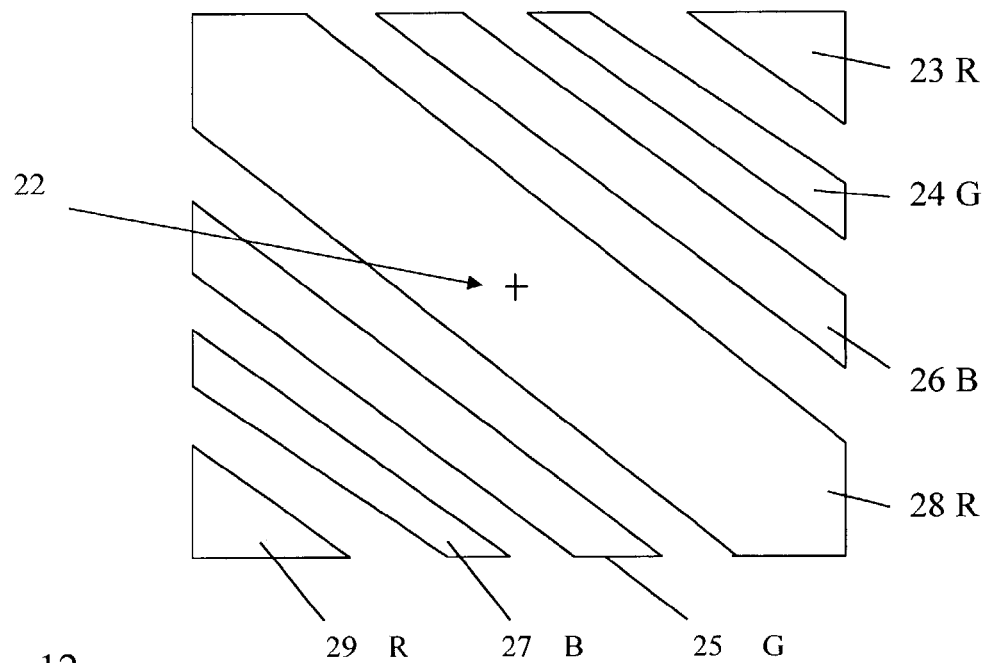
FIG. 12 shows yet a further pixel structure in accordance with an embodiment of the present invention.

FIG. 12 shows a further embodiment of the present invention which at least partially solves the symmetry problem generated by use with an optical component or the tile edge effect and/or the mask vignetting effect. This pixel structure resembles the one of FIG. 4 but is rotated through an angle such as 45° and two more strips 23 and 29 have been added. The red sub-elements 23, 28, 29 are symmetrically arranged. To make the pixel structure symmetrical about the optical center 22 for the other color elements as described for the pixel structures of the previous embodiments it is necessary to arrange the size and distance of each color element form the center such that the optical centers of all the color element coincide at the optical center 22. Thus, the green sub-element 24 is further away from the optical center 22 but is smaller in size so that its effective weight is the same as the larger green sub-element 25 placed closer to the center 22. The additional characteristic is that the pixel presents all color elements to either edge 10, 12 of a tile. In this way any light which is reflected form the edge of the transparent or opaque substrate contains the same ratio of color elements as the complete pixel. Thus this pixel structure avoids color shifts at tile edges. Further, if rectangular or square holes are formed in a mask above each pixel structure vignetting effects do not change the color seen at different viewing angles as the area of the pixel structure blocked by vignetting always contains the same proportion of the primary colors emitted by the pixel structure. Further, each color sub-element is easily accessible for contacting.

Figure 13:
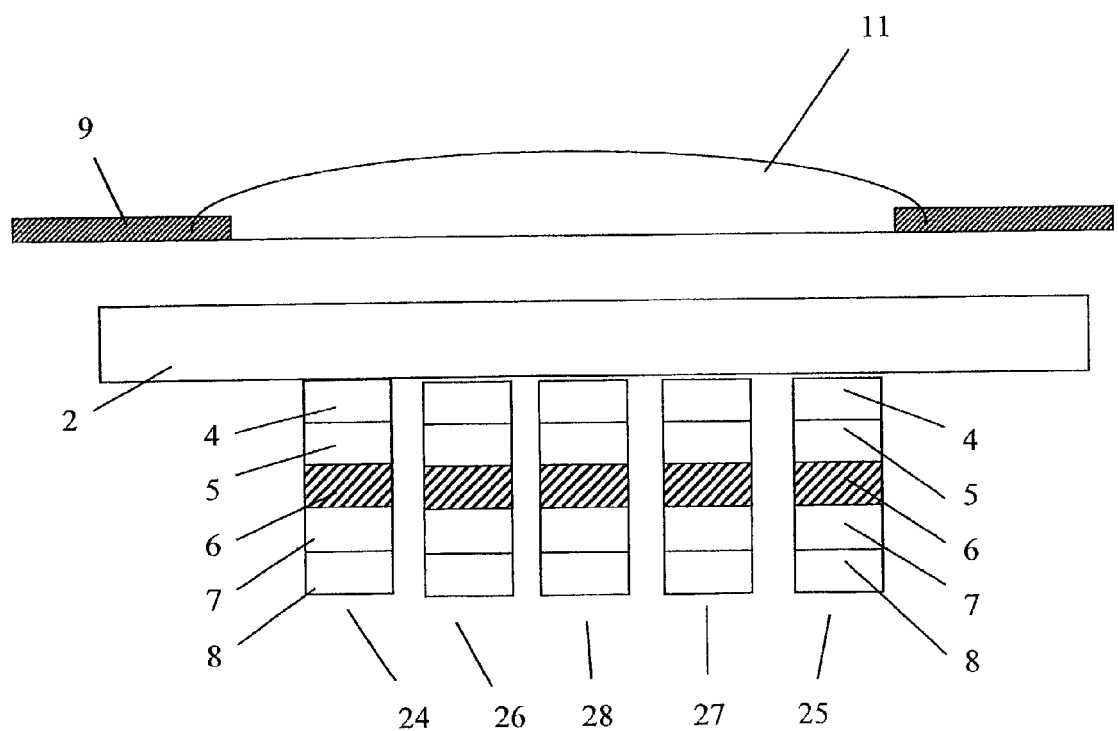
FIG. 13 shows the pixel structure of FIG. 5 with a mask and optical element in accordance with an embodiment of the present invention.

FIG. 13 shows a cross-section through a pixel structure according to FIG. 5 arranged with a non-occluding mask 9 and an optical element such as a lens 11. The layer thicknesses and the size of the pixel structure has been exaggerated compared to other dimensions for clarity reasons. Lens 11 is large enough to cover the complete pixel structure and the use of micro-lenses has been avoided.

From the above description certain aspects of the present invention can be appreciated. First of all, the optical centers of the color elements of a multi-color OLED pixel structure substantially coincide to form a single optical center for the pixel structure. This means that for any local portion of a color element of a multi-color OLED pixel structure, there is an equal location portion or an equal luminosity local portion located at a diametrically opposite location with respect to the optical center of the pixel structure. With these pixel structures, emitted light strikes an optical element in equal portions on both sides of the optical axis thereof. In certain embodiments the color elements are arranged as a sequence of substantially concentric areas, whereby the word "substantially" means that a color element does not have to surround another color element completely.

The outer color of each pixel is at each point the same as the outer color of a pixel located on the other side of a mask portion or across a join in tiles. Whatever light is emitted from one pixel close to a tile edge that is refracted or reflected from the substrate edge to thereby change, modulate, increase or decrease the luminance and/or color from that pixel, an equal and opposite effect is generated in the pixel on the other side of a join between tiles. Thus, the total light combined from two pixels lying across the join between two tiles is the total from two pixels. If the eye resolves these two pixels into a single light unit, i.e. the distance between the two pixels is less than the acuity of the eye, then the two pixels appear to emit the correct light with the correct color and luminance. However, the present invention does not require that the display is viewed at such a distance that two pixels across a mask portion are resolved as a single light entity. Even when the eye can resolve each pixel, the present invention has advantages. The effect is then to maintain the color but to have a luminance difference between pixels located across a mask portion. This luminance difference is not associated with a color shift and therefore the disturbing effect is reduced.

The outer contour of the pixel structure is preferably rectangular more preferably square when the pixel structures are arranged in a Cartesian array of a plurality of such pixel structures. Where the array has a different symmetry, e.g. polar or hexagonal, the outer shape of the pixel structure may be adapted accordingly so that the pixel structures can be tiled easily and efficiently together.

Pixels having certain forms of symmetry as included within the scope of the present invention can have additional advantages for improving the viewing characteristics of a display which are in addition to improved convergence and lack of color shifts. In one aspect of the invention, the sub-elements of one particular color will be addressed at the same time. This can be done by either having separate electrical contacts on each, addressed at the same time or by electrically connecting the sub-elements such that a single electrical signal addresses both sub-elements at the same time.

On the other hand, sub-elements can be addressed separately and used to create an additional virtual pixel with optical center in the middle between two or more pixels by simultaneously applying a current through sub-elements of neighboring pixels. Hence, sub-groups of sub-elements are addressed independently in each pixel structure. Since the central sub-element of a pixel cannot be split, a virtual pixel contains one color less but is still symmetric in at least the same directions as the real pixel. This is particularly effective when the central sub-element is highly saturated blue, since the human eye has a low detection capability for that color and does not contribute to resolution or sharpness experience.

To provide addressing of each pixel structure a drive circuit is preferably provided this drive circuit is adapted to provide power to each pixel structure, to each pixel sub-element or to groups of sub-elements in accordance with the various embodiments of the present invention.

The present invention may be used with occluded or non-occluded masks. In the case of an occluded mask, it is preferred if concentric color elements are used. The emitted light that is obscured by one side of the mask as the viewing angle is changed is provided by a portion of the pixel structure diametrically opposite which becomes visible due to the change in viewing angle.

Figure 14A:
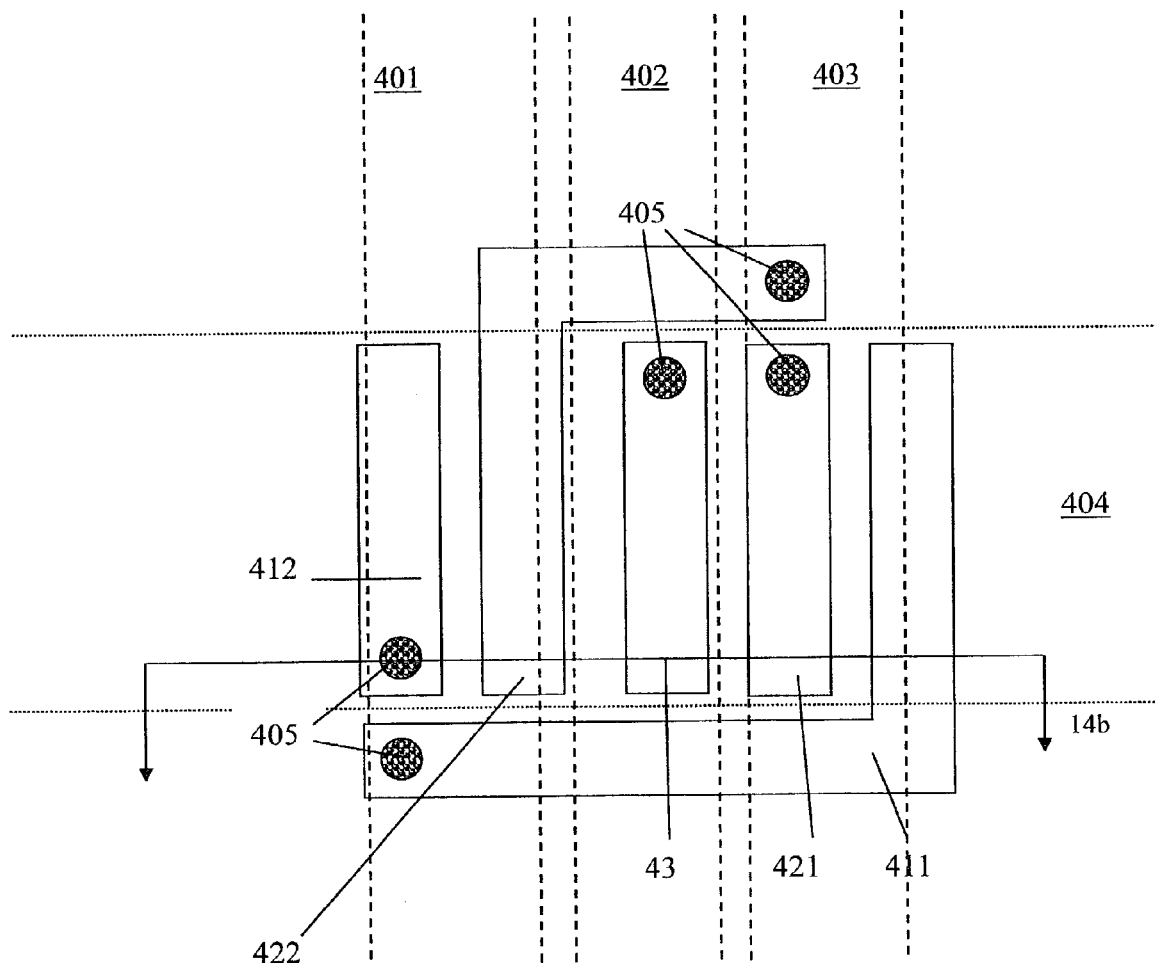
FIG. 14A shows a back view of a pixel electrode arrangement for the pixel structure of FIG. 5 in accordance with an embodiment of the present invention.
Figure 14B:
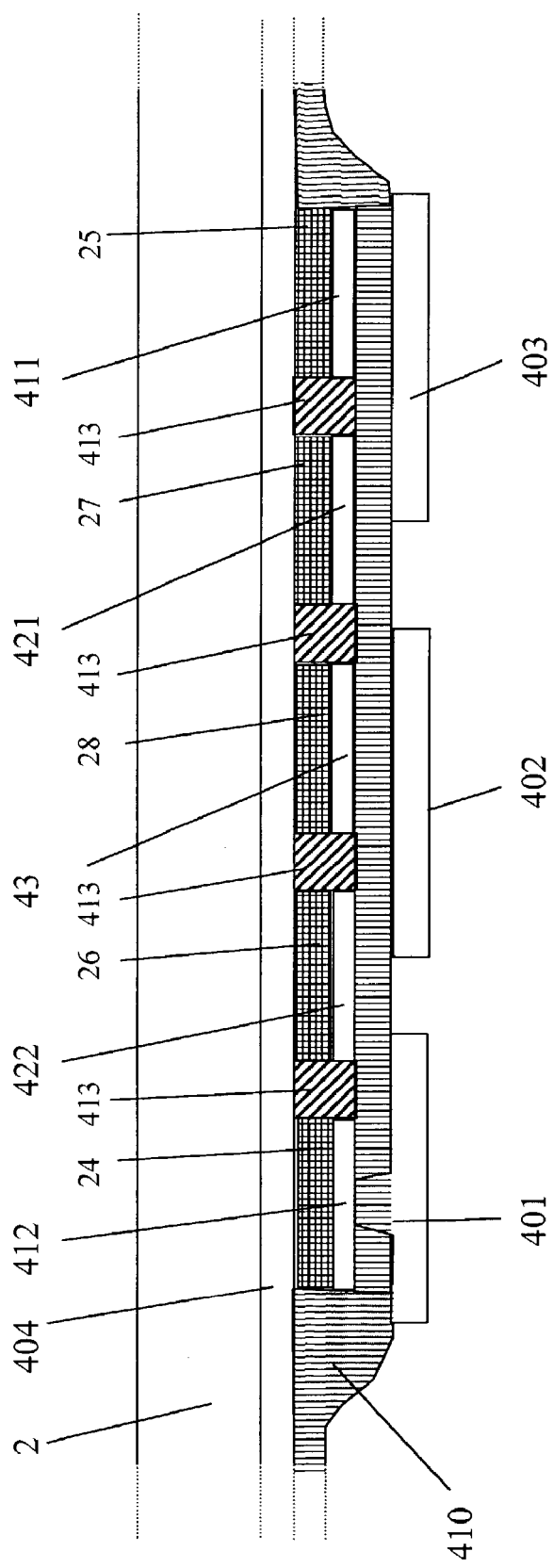
FIG. 14B shows a cross-sectional view through the arrangement of FIG. 14A.
Figure 15:
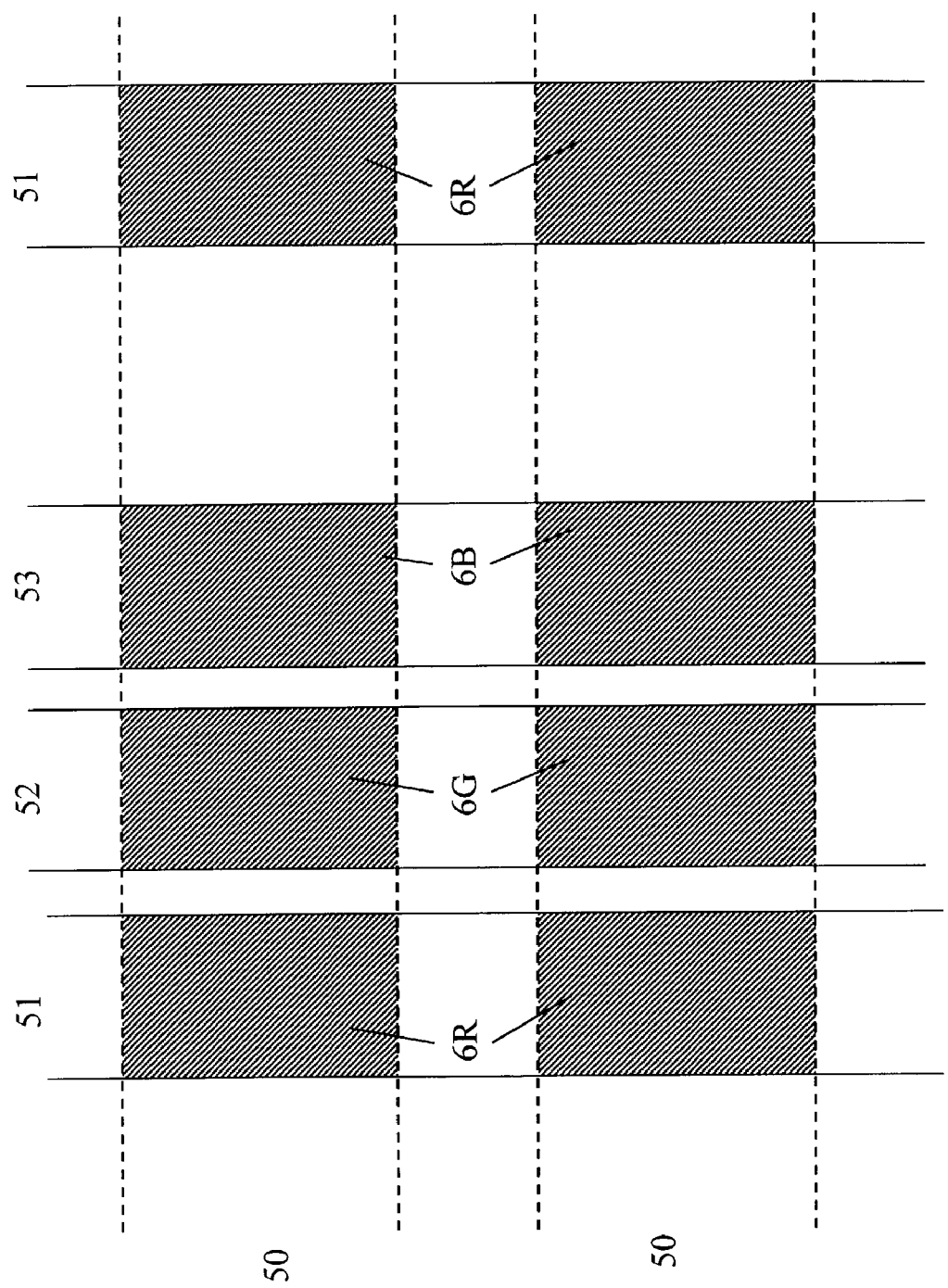
FIG. 15 shows a conventional addressing electrode scheme for an OLED display.

FIG. 14 shows how a passive matrix addressing can be obtained for a passive matrix with symmetrical pixels without increasing the number of addressing lines. In a conventional passive matrix arrangement, horizontally and vertically arranged anode and cathode lines, respectively, address a pixel as in FIG. 2. In total 4 lines are required for a pixel of FIG. 2, such as is shown in FIG. 15. Each pixel is addressed by two main electrodes, i.e. a cathode and an anode. A first main electrode comprises three transparent conductive columns 51, 52, 53, such as made from ITO, and the second main electrode is provided by a row electrode 50, usually a metal such as aluminum, in order to address each pixel. Separation between the individual elements of the main electrodes is usually done by means of insulating separators. The OLED device stack (FIG. 2) is deposited in-between the electrodes, where they intersect. When the pixel is made symmetric, e.g. using more sub-elements as shown for instance in FIG. 5, it is preferable to keep this number of address lines and not to increase it. One possible solution is demonstrated in FIG. 14a. The second main electrode line 404 covers the complete pixel area while on the other side of the pixel structure, three color emitting sub-elements are covered with pixel-local conducting, e.g. metal electrodes 412, 43, 421 of the same size. Further, pixel local conducting electrodes 422 and 411 have an extension in an L-shape. On top of these electrodes, an insulating material is deposited, with via's 405 through to the underlying electrodes. Conductive, addressing Lines 401, 402, 403 are then deposited, e.g. by metal deposition by sputtering or vapor deposition. By strategically positioning the via's 405 it is possible to contact the pixel—local electrodes 411, 412, 421, 422, 43 to the deposited first main electrode addressing lines 401, 402, 403. Additionally, this arrangement allows using at least the width of the pixel structure or more for creating the first main electrode addressing lines and thus greatly reducing the resistance, which allows increasing the number of addressable pixels in an array or increasing the currents for higher light output. FIG. 14b shows a cross-section of the arrangement through the pixel structure passing through one via 405 of the arrangement in FIG. 14a. The transparent row addressing electrodes 404 are deposited onto the transparent substrate 2. The OLED stacks 24, 26, 28, 27, 25 are deposited onto this electrode 404. Pixel-local electrodes 412, 422, 43, 421, 411 are deposited over the OLED stacks 24, 26, 28, 27, 25, respectively with insulating spacers 413 therebetween. Then an insulating layer 410 is deposited over the complete back of the display and vias opened to the pixel-local electrodes. Then three metal addressing electrodes 401, 402, 403 are deposited in such a way that the make contact with the pixel-local electrodes 412, 422, 43, 421, 411.

Figure 16:
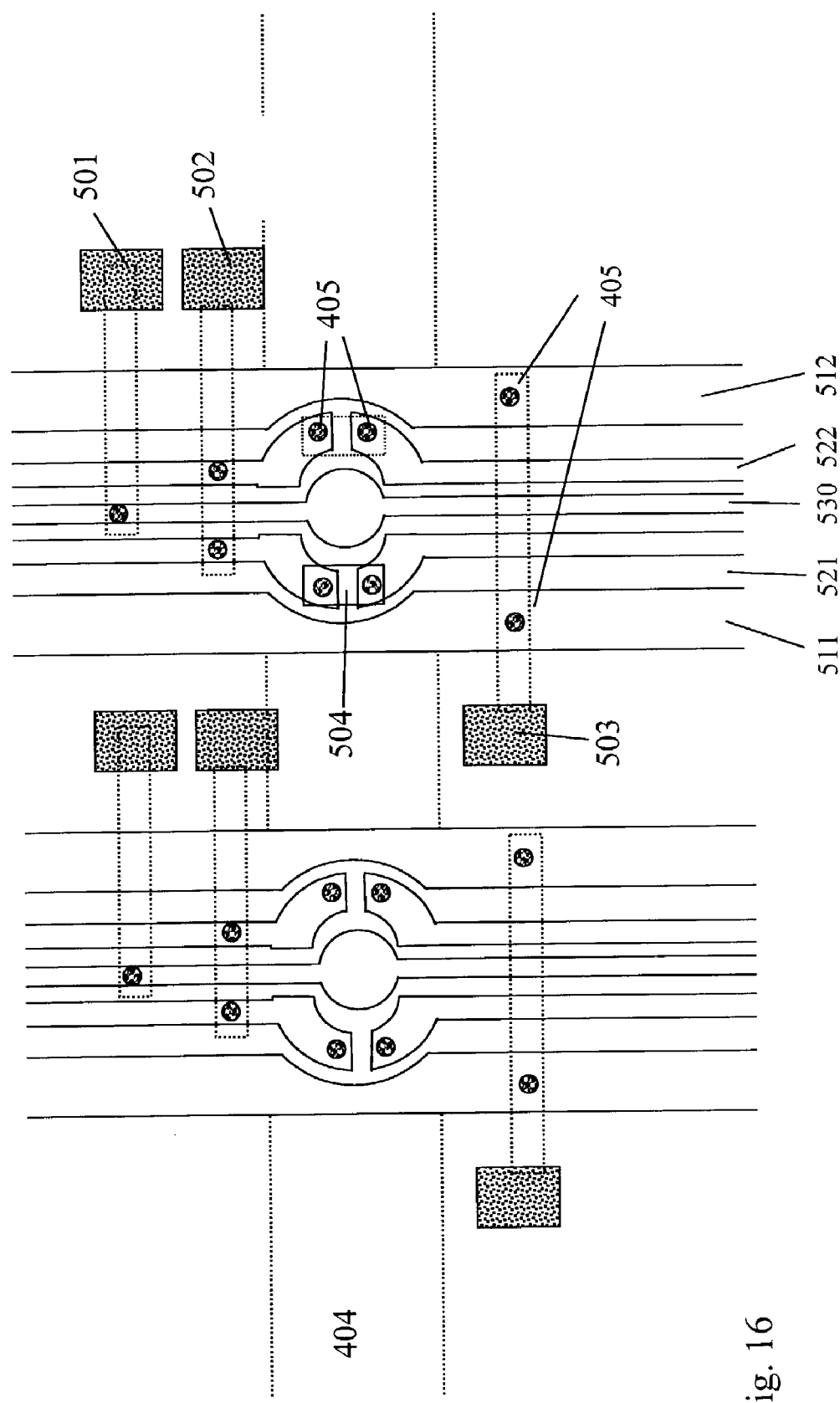
FIG. 16 shows an addressing electrode arrangement for the pixel structure of FIG. 11 in accordance with an embodiment of the present invention.
Figure 17A:
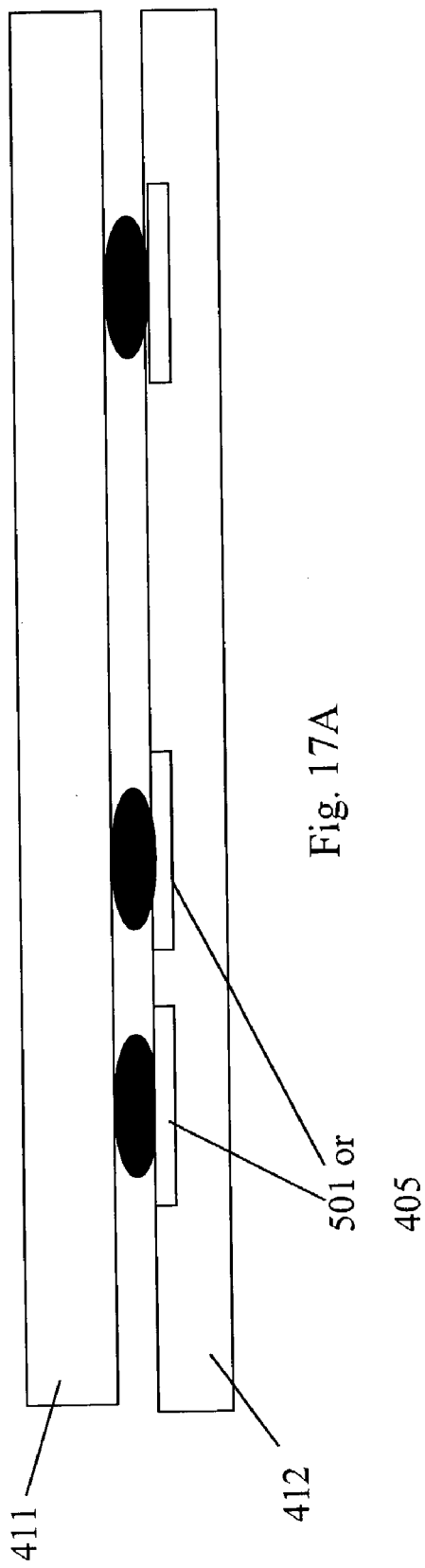
FIG. 17A shows a cross-section through a display element and a driver board in accordance with an embodiment of the present invention.

Another arrangement in accordance with an embodiment of the present invention is as shown in FIG. 16. This figure shows an electrode arrangement of the pixel demonstrated in FIG. 11. The sub-elements are addressable by addressing lines 511, 512, 521, 522, 530. On a second layer, the isolating gap 23 in the quarter segments of the intermediate pixel element 26 is bridged on either side by conductive strips 504. Then the addressing lines 511, 512; 521, 522 left and right of the center are electrically connected by conductive strips to pads 502 and 503, respectively. The central line 530 is connected to a further pad 501 by a conductive strip. In this embodiment, the addressing lines may be linked through larger contact pads 501-503, accessible from the rear of the display, for interconnection to a backplane. This is done to move the interconnection region of the electrodes to the electronics of a display away from the edges of a display array and reducing the required minimum seams between tiles for a tiled display. Also, this back interconnection method allows for redundant contact to pixel structures, increasing reliability and reducing the resistance of the addressing lines. Indeed, the resistance is no longer determined by the distance between the edge where the display is connected and a particular pixel, but the distance between the pixel and its nearest interconnection. In FIG. 17A the pads 501-3 of a display 411 are connected to a PCB 412 via conductive connections, e.g. by conductive adhesive or solder.

Figure 17B:
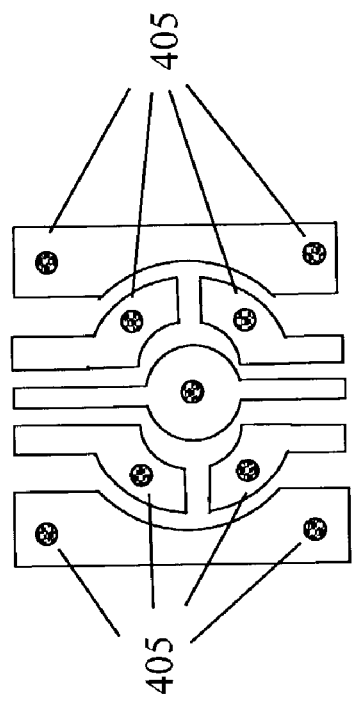
FIG. 17B shows and alternative electrode arrangement for the pixel structure of FIG. 11 in accordance with an embodiment of the present invention.

Instead of creating a second layer with electrode material, is also possible to address the pixels and its sub-elements through a back panel, connected to via's 405 as shown in FIG. 17B with a conductive material, e.g. a conductive adhesive as also is demonstrated in FIG. 17A. The number and diameter of via's 405 can be adapted to the current required for each sub-element.

It is to be understood that although preferred embodiments, specific constructions and configurations have been discussed herein for devices according to the present invention, various changes or modifications in form and detail may be made without departing from the scope and spirit of this invention.

What is claimed is:

1. A multicolor OLED pixel structure, comprising:
   a plurality of light emitting color elements, each color element emitting light of a particular color;
   the optical centers of the plurality of color elements coinciding substantially at an optical center for the pixel structure;
   a portion of each color element of the pixel structure having an equally luminous portion of the same color element located diametrically opposite thereto with respect to the optical center of the pixel structure and
   a first color element of said plurality of light emitting color elements substantially encompassing a second color element of said plurality of light emitting color elements.

2. The pixel structure of claim 1, the pixel structure being positioned on a substrate having a substrate surface at a viewing side for the pixel structure, each color element being positioned in a different area of a plane parallel to the substrate surface.

3. The pixel structure of claim 1, wherein the plurality of light emitting color elements are adapted to be able to all contribute light to form emitted white light.

4. The pixel structure of claim 1, wherein an outer shape of the pixel structure is polygonal, circular or rectangular.

5. The pixel structure according to claim 1, wherein the plurality of light emitting color elements comprise elements which emit light of one of three primary colors, and one or more color elements emitting one primary color are arranged substantially concentrically with respect to one or more color elements emitting another primary color.

6. The pixel structure according to claim 1, wherein the pixel structure has light emitting area defined by an outer envelope and the plurality of light emitting color elements comprise elements which emit light of one of a number of primary colors, a light emitting element of each primary color extending to the outer envelope.

7. The pixel structure according to claim 1, wherein the pixel structure is sandwiched between a first main electrode common to all light emitting color elements and a plurality of second electrodes, each second electrode contacting at least one of the light emitting color elements.

8. The pixel structure according to claim 7, wherein the pixel structure has a plurality of conducting areas local to each pixel for connection to an electrical power supply.

9. The pixel structure of claim 7, wherein a second electrode contacts at least two light emitting color elements of one color.

10. The pixel structure according to claim 1, wherein a first color element of said plurality of light emitting color elements substantially encompassing a second color element of said plurality of light emitting color elements is a first color element of said plurality of light emitting color elements substantially surrounding a second color element of said plurality of light emitting color elements.

11. The pixel structure according to claim 1, wherein said plurality of light emitting color elements comprises three color elements.

12. An array of pixel structures, each pixel structure being located on a substrate, each pixel structure comprising:
   a plurality of light emitting color elements, each color element emitting light of a particular color;
   the optical centers of the plurality of color elements coinciding substantially at an optical center for the pixel structure;
   portion of each color element of the pixel structure having an equally luminous portion of the same color element located diametrically opposite thereto with respect to the optical center of the pixel structure, and
   a first color element of said plurality of light emitting color elements substantially encompassing a second color element of said plurality of light emitting color elements.

13. An array of pixel structures according to claim 12, each pixel structure being positioned on a substrate having a substrate surface at a viewing side for the pixel structure, each color element being positioned in a different area of a plane parallel to the substrate surface.

14. The array according to claim 12, wherein the plurality of light emitting color elements are adapted to be able to all contribute light to form emitted white light.

15. The array according to claim 12, wherein the outer shape of each pixel structure is polygonal, circular or rectangular.

16. The array according to claim 12, wherein, for each pixel structure, the plurality of light emitting color elements comprise elements which emit light of one of three primary colors, and one or more color elements emitting one primary color are arranged substantially concentrically with respect to one or more color elements emitting another primary color.

17. The array according to claim 12, wherein each pixel structure has a light emitting area defined by an outer envelope and the plurality of light emitting color elements comprise elements which emit light of one of a number of primary colors, a light emitting element of each primary color extending to the outer envelope of each pixel structure.

18. The array according to claim 12, wherein each pixel structure is sandwiched between a first main electrode common to all light emitting color elements and a plurality of second electrodes, each second electrode contacting at least one of the light emitting color elements.

19. The array according to claim 12, further comprising a drive circuit for driving the pixel structures.

20. The array according to claim 19, wherein the drive circuit is adapted for driving each color element separately of a pixel structure.

21. The array according to claim 19, wherein the drive circuit is adapted for driving a first group of color elements of a pixel structure independently of a second group of color elements of the same pixel.

22. The array according to claim 19, wherein each pixel structure has a plurality of conducting areas local to each pixel for connection to an electrical power supply.

23. The array according to 19, wherein each pixel structure has a plurality of conducting areas local to each pixel for connection to a PCB.

24. The array according to claim 12, wherein the array has a display direction and further comprising an optical element located on the display direction side of the array.

25. The array according to claim 24, wherein the optical element is a vignetting element.

26. The array according to claim 24 wherein the optical element is a lens.

27. The array according to claim 24, further comprising a mask.

28. A passive or active matrix OLED display comprising an array according to the claim 12.

29. The passive or active matrix OLED display according to claim 28, wherein the display is a display tile.

30. The array according to claim 12, wherein a first color element of said plurality of light emitting color elements substantially encompassing a second color element of said plurality of light emitting color elements is a first color element of said plurality of light emitting color elements substantially surrounding a second color element of said plurality of light emitting color elements.

31. The array according to claim 12, wherein said plurality of light emitting color elements comprises three color elements.

32. A method of manufacture of a multicolor OLED pixel structure, comprising:
   forming a plurality of light emitting color elements on a substrate, each color element being for emitting light of a particular color; the optical centers of the plurality of color elements coinciding substantially at an optical center for the pixel structure; portion of each color element of the pixel structure having an equally luminous portion of the same color element located diametrically opposite thereto with respect to the optical center of the pixel structure and a first color element of said plurality of light emitting color elements substantially encompassing a second color element of said plurality of light emitting color elements.

33. A method of manufacture according to claim 32, wherein forming a plurality of light emitting color elements on a substrate comprises forming a plurality of light emitting color elements on a substrate having a substrate surface parallel with a viewing side for the pixel structure, each color element being positioned in a different area of a plane parallel to the substrate surface.

34. The method of manufacturing according to claim 32, wherein a first color element of said plurality of light emitting color elements substantially encompassing a second color element of said plurality of light emitting color elements is a first color element of said plurality of light emitting color elements substantially surrounding a second color element of said plurality of light emitting color elements.

35. The method of manufacturing according to claim 32, wherein said plurality of light emitting color elements comprises three color elements.

* * * * *